(12) United States Patent
Clark et al.

(10) Patent No.: US 6,182,829 B1
(45) Date of Patent: *Feb. 6, 2001

(54) I.C. CARRIER INSERT

(75) Inventors: William S. Clark, Wyoming; Donald L. Fulcher, Fridley; David A. Johnson, Wayzata; Martin L. Cavegn, North St. Paul; Chad Van Hove, Roseville; John E. Nelson, Brooklyn Park, all of MN (US)

(73) Assignee: JohnsTech International Corporation, Minneapolis, MN (US)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/058,942

(22) Filed: Apr. 10, 1998

Related U.S. Application Data

(60) Provisional application No. 60/043,861, filed on Apr. 11, 1997.

(51) Int. Cl.[7] .................................................... B65D 73/02
(52) U.S. Cl. ........................... 206/719; 206/724; 439/330
(58) Field of Search .................................. 206/701, 719, 206/721, 722–724, 725, 726, 727, 728, 305, 562–563, 328–334, 39.6, 449; 220/604, 62; 229/169; 324/537, 538, 158.1; 439/507, 330

(56) References Cited

U.S. PATENT DOCUMENTS

| | | | | |
|---|---|---|---|---|
| 1,740,424 | * | 12/1929 | Blaine ................................... | 206/449 |
| 1,910,888 | * | 5/1933 | Gerald .................................... | 220/62 |
| 4,450,955 | * | 5/1984 | Featherston ......................... | 206/39.6 |
| 4,681,221 | * | 7/1987 | Chickanosky et al. ............... | 206/719 |
| 4,706,161 | * | 11/1987 | Buckingham ........................ | 206/724 |
| 4,725,918 | * | 2/1988 | Bakker ................................. | 206/722 |
| 4,832,612 | * | 5/1989 | Grabbe et al. ....................... | 206/722 |
| 4,848,571 | * | 7/1989 | Fullar .................................. | 206/372 |
| 5,167,326 | * | 12/1992 | Murphy ................................ | 206/719 |

* cited by examiner

*Primary Examiner*—Luan K. Bui
(74) *Attorney, Agent, or Firm*—Nawrocki, Rooney & Sivertson, P.A.

(57) ABSTRACT

An insert for use within integrated circuit (IC) chip carriers to provide universality across device types and applications at a low design and fabrication cost. The present invention functions as a generic carrier floor and/or adaptor insert which enables reception of both quad-flat-pack (QFP) and thin-quad-flat-pack (TQFP) ICs within frames of a variety of existing carriers, or alternatively, may allow both QFP and TQFP ICs to utilize a single IC carrier frame, a feature which currently prevailing embodiments would require two unique IC carriers.

11 Claims, 3 Drawing Sheets

I.C. CARRIER INSERT

CROSS REFERENCE TO RELATED APPLICATIONS

This is a regular application filed under 35 U.S.C. §111(a) claiming priority, under 35 U.S.C. §119(e) (1), of provisional application Ser. No. 60/043,861, previously filed Apr. 11, 1997 under 35 U.S.C. §111(b).

BACKGROUND OF THE INVENTION

1. Field of the Invention

The present invention relates to Integrated Circuit (IC) chip carriers for transport and handling of IC devices, and more specifically to a generic insert for chip carriers which allows universality across device types and applications.

2. Description of the Prior Art

In the manufacture of electronic devices such as Integrated Circuits (IC's), there is constant pressure to produce less expensive, dimensionally smaller devices while simultaneously increasing the density of electronic functions within the devices. In order to reduce the unit costs in the production of such devices, manufacturers have increased the test speed of the devices by testing a plurality of the devices at the same time.

It has become standard practice within the semiconductor industry to place a number of electronic devices to be tested on a test tray and position them so as to be engaged by a test head plate having a number of corresponding test contactors. Each device is placed on a seat of a device called a chip carrier, further described below. A number of chip carriers are then positioned in both columns and rows on a test tray. The test tray having a number of chip carriers is arranged so as to be in vertical alignment (either above or below) with a test fixture. The test fixture includes test contactors (test pins) for contact with pins of each device to be tested for supplying and receiving the test signals from the device. Each carrier module is aligned with a corresponding test contactor so that when either the test tray or the test fixture are moved in a vertical direction toward the other, the contactor engages the electronic device positioned within the carrier module.

The contactor is provided with a number of test pins or leads which come into electrical communication with the leads of the electronic devices to be tested. The automatic test handler is electrically connected to a electronic device test system, for example, an IC tester which includes a test signal generator for supplying a test signal to the device, and with a signal comparator for analyzing the results of the test. Based on such results, the electronic devices are transferred to another location in the test process and sorted for proper handling.

The size and configuration of standard electronic chips are rapidly changing. Some of the high speed ICs have very short signal leads, instead of the relatively longer leads used in the conventional package types, such as QFP (quad-flat-pack). For example, newer types of IC devices are molded in packages called thin-quad-flat-pack (TQFP). When utilizing a test tray to test such IC devices, it is necessary to employ a new carrier module to secure an electrical isolation between the leads and also to eliminate the deformation of the leads of the IC devices.

IC carriers have typically been rather complex three dimensional devices fabricated by a variety of means, typically from some thermal-setting or thermoplastic material. Due to the complex three dimensional fine-structure sometimes required in the carriers due to the material nature of the carriers, brittleness and/or fragileness of the carrier may ensue. Also, as mentioned above, minor modifications in the IC device package or the environment of the application may cause a redesign and retool of the carrier, which is often an expensive proposition.

SUMMARY OF THE INVENTION

The present invention overcomes many of the disadvantages associated with the prior art by providing an insert for use within integrated circuit (IC) chip carriers to provide universality across device types and applications at a low design and fabrication cost.

In a preferred embodiment, the present invention may function as a generic carrier floor and/or adaptor insert which will allow both quad-flat-pack (QFP) and thin-quad-flat-pack (TQFP) ICs to be placed within a variety of existing carriers. In another embodiment, the present invention may function as a generic carrier floor and/or adaptor insert which will allow both quad-flat-pack (QFP) and thin-quad-flat-pack (TQFP) ICs to utilize a single IC carrier, a feature which currently prevailing embodiments would require two unique IC carriers. In a preferred embodiment, the IC insert is fabricated from a metal (such as stainless steel), which in addition to its characteristic malleability, also offers the attributes of strength and a relatively low cost. In alternate embodiments, the IC insert may be fabricated from other materials, such as plastic, polyimide, etc.

In a preferred embodiment, the insert of the present invention is formed from a two-dimensional metal (such as stainless steel) blank which contains protruding tabs and isolation windows defined within the blank which provide access to the leads of the associated IC device. The isolation windows also provide DC isolation between the leads of the IC and the IC insert itself. The protruding tabs of the two dimensional metal blank may be bent so as to define a third dimensional aspect to the embodiment which may serve to secure the IC insert to the chip carrier. In alternate embodiments, the insert may be secured to the carrier via glue, screws, rivets, etc.

BRIEF DESCRIPTION OF THE DRAWINGS

Other objects of the present invention and many of the attendant advantages of the present invention will be readily appreciated as the same becomes better understood by reference to the following detailed description when considered in connection with the accompanying drawings, in which like reference numerals designate like parts throughout the figures thereof and wherein.

DETAILED DESCRIPTION OF THE INVENTION

Figure 1:
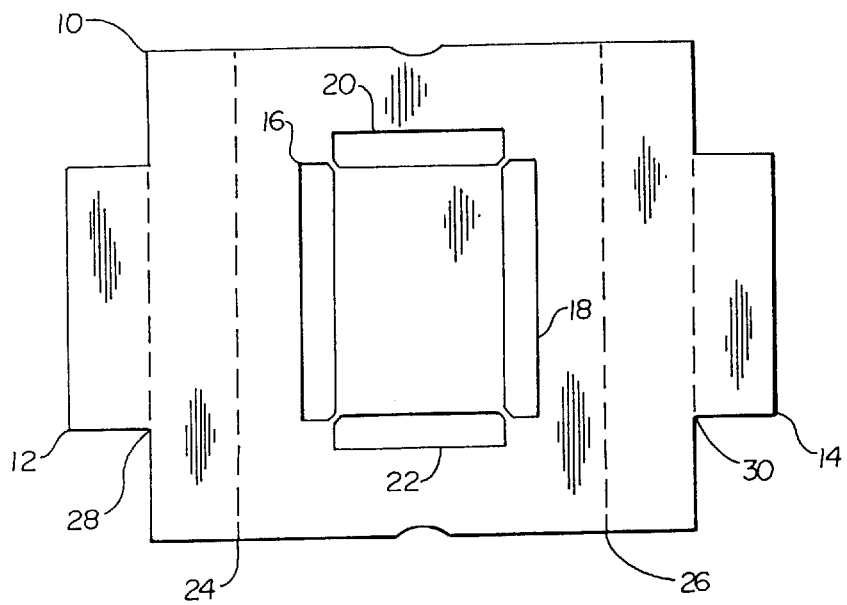
FIG. 1 is a top view drawing illustrating a preferred embodiment of the chip carrier insert of the present invention before bending.

FIG. 1 is a top view drawing illustrating a preferred embodiment of the chip carrier insert of the present invention before bending. In FIG. 1, a two-dimensional malleable blank 10 is shown. The blank 10, which can be made of metal, is designed to function as a generic carrier floor and/or adaptor insert which enables reception of both quad-flat-pack (QFP) and thin-quad-flat-pack (TQFP) IC's within frames of a variety of existing carriers. The metal blank 10 is preferably made of stainless steel (such as 0.015"302 Stainless), which exhibits superior characteristics of malleability. Stainless steel also offers the attributes of strength and a relatively low cost. In alternate embodiments, the blank can be made of other materials, such as plastic, polyimide, etc.

In a preferred embodiment, the metal blank 10 is of a roughly rectangular shape, with two protruding tabs 12 and 14 extending lengthwise from a main body of the metal blank 10. The two protruding tabs 12 and 14, will be bent in order to provide means of securing the metal blank 10 to the chip carrier hanging frame. In alternate embodiments, other fastening means such as glue, screws, rivets, etc. can be employed to secure the metal blank 10 to the chip carrier hanging frame. The metal blank 10 defines four rectangular isolation windows 16, 18, 20 and 22. These isolation windows 16, 18, 20, 22 are dimensionally positioned within the surface of the metal blank to accommodate the leads of a QFP and/or TQFP package.

In a preferred embodiment, the length of the metal blank 10 is approximately 50 mm including the length of the two protruding tabs 12 and 14, and is approximately 43 mm excluding the length of the two protruding tabs 12 and 14. The metal blank 10 is approximately 38 mm wide. Each protruding tab 12 and 14 is approximately 3 mm wide and 20 mm long.

In order to attach the metal blank 10 to the chip carrier hanging frame, the metal blank 10 may be bent to form a three-dimensional structure which wraps around a portion of the chip carrier hanging frame. In a preferred embodiment, two bends of approximately 90 degrees are made approximately 14 mm left and right of the lengthwise center of the metal blank 10, as shown at bend locations 24 and 26. Additionally, two bends of approximately 90 degrees are made approximately 21.5 mm left and right of the lengthwise center of the metal blank 10, as shown at bend locations 28 and 30.

Figure 2:
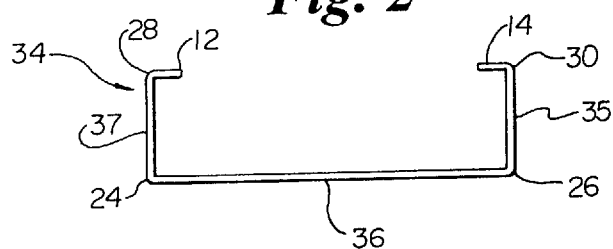
FIG. 2 is a cross sectional side view drawing illustrating a preferred embodiment of the chip carrier insert of the present invention after bending.

FIG. 2 illustrates a lengthwise cross sectional view of a preferred embodiment of the chip carrier insert after bending. After the metal blank 10 is bent as described in the previous figure, the resultant chip carrier insert 34 now has a three dimensional structure. The chip carrier insert floor 36 has a length of approximately 28 mm, and a width of approximately 38 mm. At bend locations 24 and 26, the carrier insert walls 34 and 35 will rise to a height of about 8 mm at an approximately 90 degree angle from the carrier insert floor 36.

At bend locations 28 and 30, protruding tabs 12 and 14 are bent at about a 90 degree angle toward the center of the carrier insert 34, such that the protruding tabs 12 and 14 are now approximately parallel to the carrier insert floor 36. After bending, the protruding tabs 12 and 14 will extend approximately 2.3 mm lengthwise toward each other.

Figure 3:
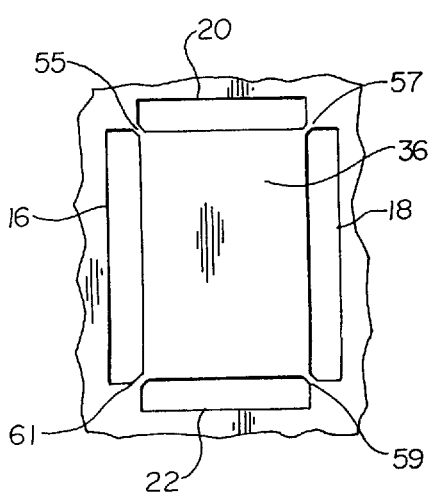
FIG. 3 is a close-up view of the bottom surface of the chip carrier insert of the present invention after bending.

The dimensional attributes of the carrier insert 34 described above are merely illustrative of one embodiment of the present invention. The present invention anticipates that carrier inserts 34 of varying sizes and bend configurations may be used to adapt to varying sizes and shapes of chip carriers. FIG. 3 is a close-up view of the floor of the chip carrier insert of the present invention after bending. As described earlier in FIG. 1 and FIG. 2, there are four isolation windows 16, 18, 20 and 22 defined within chip carrier insert to accommodate the leads of a QFP and/or TQFP package. These isolation windows 16, 18, 20 and 22 provide access to the leads of an associated IC device, when the IC device is positioned within the chip carrier. Additionally, the isolation windows 16, 18, 20 and 22 also provide DC isolation between the leads of the IC device and the chip carrier insert 34 itself.

In a preferred embodiment, the isolation windows 16, 18, 20 and 22 defined within the carrier insert floor 36, are dimensionally oriented such as to fit a 100 pin quad-flat-pack device. In this configuration, the isolation windows 16 and 18 are approximately 20 mm in length and 6.7 mm in width, while isolation windows 20 and 22 are approximately 13.4 mm in length and approximately 6.7 mm in width. Isolation windows 16 and 18 are separated by approximately 13.4 mm, and isolation windows 20 and 22 are separated by approximately 19.4 mm.

The chip carrier insert floor 36 area formed within the inside perimeter of the four isolation windows 16, 18, 20 and 22 is approximately 19.4 mm in length and 13.4 mm in width. Each of the isolation windows 16, 18, 20 and 22 is separated from its adjacent isolation windows by a metal bridge 55, 57, 59 and 61.

In a preferred embodiment, the chip carrier insert floor area 36 may be rendered dielectric. As an illustrative example, the carrier insert floor 36 may be made non-conductive through oxidation, or the application of a non-conductive coating to the surface of the chip carrier insert floor 36.

The dimensional attributes of the isolation windows 16, 18, 20 and 22 and the chip carrier insert floor 36 are merely illustrative of one embodiment of the present invention. The present invention anticipates that isolation windows 16, 18, 20 and 22 and chip carrier insert floors 36 of varying sizes and configurations may be used to adapt to varying sizes and shapes of a wide range of IC devices.

Figure 4:
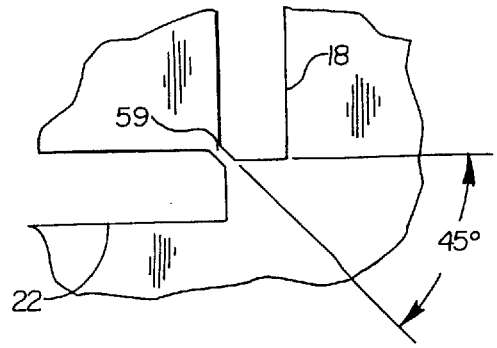
FIG. 4 is a close-up view of a bottom surface corner of the chip carrier insert.

FIG. 4 is a close up view of the chip carrier insert floor 36 showing a metal bridge 59 spanning the area between two adjacent isolation windows 18 and 22. In a preferred embodiment, the metal bridges 55, 57, 59 and 62 serve to separate two adjacent isolation windows and also to connect the carrier insert floor area inside the isolation windows to the rest of the chip carrier insert assembly 34.

In the illustrated embodiment, the metal bridge 59 is oriented at approximately 45 degrees from the lengthwise orientation of the two adjacent isolation windows 18 and 22. The metal bridge is approximately 0.375 mm in width.

In a preferred embodiment, the metal bridges 55, 57, 59, and 62 can incorporate a "break away" feature, wherein the floor area inside of the isolation windows (FIG. 3, element 36) will deform or completely detach from the rest of the chip carrier insert assembly 34 at the metal bridges 55, 57, 59, and 62 when an excessive force is applied to the device resting on the chip carrier floor area. This feature is especially useful in testing applications, where a malfunction occurs in the testing procedure. As a result of this "break away" feature, the sacrificial breakage or deformation of the chip carrier insert assembly 34 occurs in favor of damage to a more expensive component, such as the test socket, chip carrier handling device, test equipment, or the IC to be tested.

As an example, it is possible to control the pressure level at which the aforementioned "break away" feature is deployed through variations in the thickness of the bridges 55, 57, 59 and 62, the width of the bridges 55, 57, 59 and 62, or the materials used for the bridges 55, 57, 59 and 62. These examples are merely illustrative of three embodiments of the present invention. The present invention anticipates that many additional methods and/or devices may be used to control he point of sacrificial breakage or deformation of the floor of the chip carrier insert assembly upon excessive pressure.

Figure 5:
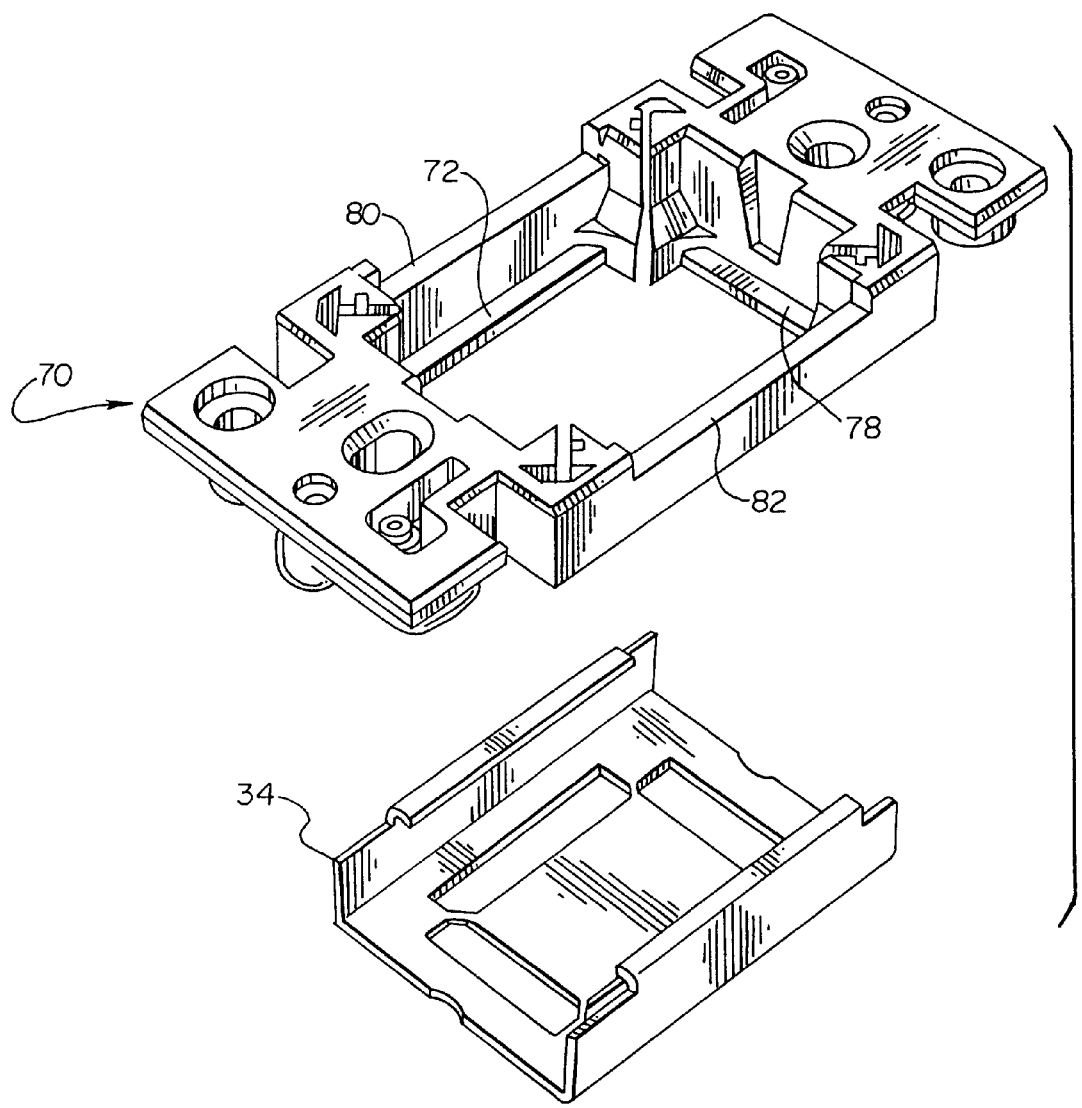
FIG. 5 is a top view illustration of a chip carrier hanging frame.

FIG. 5 is a top view illustration of a chip carrier assembly 70 having a hanging frame. The chip carrier assembly 70 is used in the transport and handling of ICs in a number of applications, including testing. The relatively complex structure and tight dimensional tolerances of the chip carrier assembly 70, along with the industry practice of changing the packaging of IC devices very frequently, makes the re-tooling of such chip carriers a very expensive proposition.

In the illustrative embodiment, an IC device may rest upon ridges/shelves 72 and 78 located within the interior of the chip carrier 70. The chip carrier 70 may also have engaging surfaces 80 and 82 where a chip carrier insert 34 may be secured. The ridges/shelves 72 and 78 may serve as a floor upon which the IC device is suspended. Because of the fixed dimensional nature of the ridges/shelves 72 and 78 within the chip carrier 70, the chip carrier 70 can only support a limited number of IC devices (often only 1) which have appropriate dimensional characteristics.

The attributes of the chip carrier assembly 70 described above are merely illustrative of one embodiment of the present invention. The present invention anticipates that chip carrier assemblies 70 having differing attributes of size, shape and configuration may also be employed in conjunction with the present invention.

Figure 6:
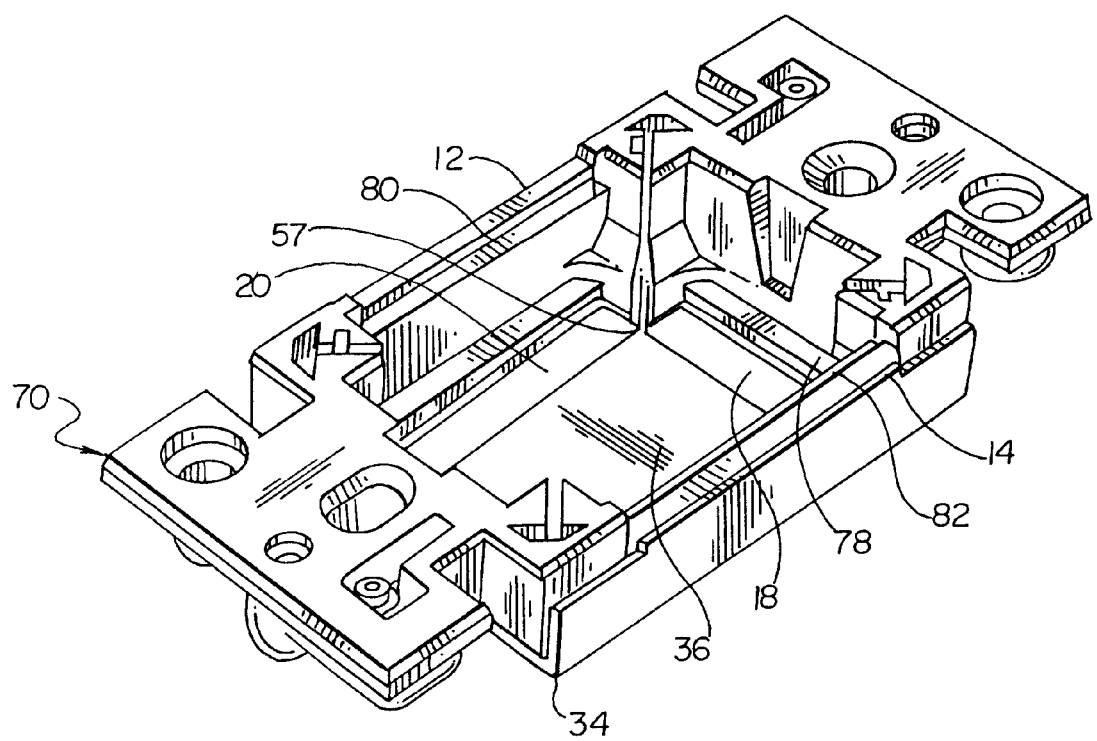
FIG. 6 is a top view illustration of a chip carrier hanging frame with a chip carrier insert secured to the carrier.

FIG. 6 is a top view illustration of a chip carrier 70 with a chip carrier insert 34 secured to the carrier 70. In a preferred embodiment, the chip carrier insert 34 is bent as shown in FIG. 2 such that the protruding tabs 12 and 14 secure the chip carrier insert 34 to the engaging surfaces 80 and 82 of the chip carrier 70 (the chip carrier hanging frame). In addition to serving as a securing point where the chip carrier insert is attached to the chip carrier hanging frame, the engaging surfaces 80 and 82 of the hanging frame are recessed so as to also serve as an alignment feature for properly positioning the insert on the hanging frame. It is contemplated that the chip carrier insert 34 can have other features which would enable it to be properly aligned with the chip carrier 70. When the chip carrier 70 hanging frame is properly engaged by the chip carrier insert 34, the chip carrier insert floor 36 will be securely suspended along the bottom surface of the chip carrier 70, such that the isolation windows 16, 18, 20 and 22 will be positioned properly for the insertion of an IC device into the chip carrier 70.

Thus, a chip carrier insert 34 such as illustrated here enables a chip carrier 70 to be easily adapted to support new IC package types. In another embodiment, the chip carrier insert 34 may allow both quad-flat-pack (QFP) and thin-quad-flat-pack (TQFP) ICs to utilize a single IC carrier, a feature which currently prevailing embodiments would require two unique IC carriers.

By varying the horizontal position and/or thickness of the chip carrier insert floor 36 employed within the present invention, the vertical position of the leads of the IC device resting upon the insert floor 36 may be precisely determined. In other words, the high degree of customizability available with the chip carrier floor 36 of the present invention allows the plane of device leads of an IC device resting upon the chip carrier floor 36 to be positioned exactly as needed for a particular application.

Having thus described the preferred embodiments of the present invention, those of skill in the art will readily appreciate that the teachings found herein may be applied to yet other embodiments within the scope of the claims hereto attached.

What is claimed is:

1. Apparatus for use in testing integrated circuit chips comprising:
    a) an integrated circuit chip carrier having an interior in which an integrated circuit chip including a plurality of leads is received; and
    b) an insert arranged to engage and partially enclose an integrated circuit chip, said insert being formed from an initially planar malleable blank including:
        (i) at least one portion bendable over a corresponding ridge of the chip carrier to secure said blank to the chip carrier with said blank having at least one window formed therethrough; and
        (ii) when an integrated circuit chip, engaged by said blank, is received in the interior of the chip carrier and said blank is secured to the chip carrier, at least one of said window overlying at least one of the integrated circuit leads to expose the at least one of the integrated circuit leads.

2. The apparatus in accordance with claim 1 wherein said blank includes oppositely-facing surfaces, and wherein, when said blank is secured to the chip carrier, one of said oppositely-facing surfaces defines a carrier floor for an integrated circuit received in the interior of the chip carrier.

3. The apparatus in accordance with claim 2 wherein said blank includes a plurality of windows, each overlying, when an integrated circuit is received in the interior of the chip carrier and said blank is secured to the chip carrier, a different portion of the integrated circuit leads to expose substantially all of the leads.

4. The apparatus in accordance with claim 3 wherein said windows generally define a rectangle in said blank.

5. The apparatus in accordance with claim 4 wherein adjacent windows which are transverse to one another define a thin bridge therebetween.

6. The apparatus in accordance with claim 5 wherein said bridges are frangible upon application of excessive force upon said floor.

7. The apparatus in accordance with claim 5 wherein said bridges are deformable upon application of excessive force upon said floor.

8. The apparatus in accordance with claim 5 wherein said floor is electrically non-conductive.

9. The apparatus in accordance with claim 8 wherein said blank is made of plastic.

10. The apparatus in accordance with claim 8 wherein said blank is made of polyamide.

11. The apparatus in accordance with claim 1 comprising a pair of bendable tabs, each bendable over a corresponding ridge of the chip carrier to secure said blank to the chip carrier.

* * * * *